United States Patent
Kawamura et al.

(10) Patent No.: US 9,423,446 B2
(45) Date of Patent: Aug. 23, 2016

(54) INSULATION STATE DETECTING DEVICE

(71) Applicants: YAZAKI CORPORATION, Tokyo (JP); HONDA MOTOR CO., LTD., Tokyo (JP)

(72) Inventors: Yoshihiro Kawamura, Shizuoka (JP); Mitsunori Matsumoto, Saitama (JP)

(73) Assignees: YAZAKI CORPORATION, Tokyo (JP); HONDA MOTOR CO., LTD., Tokyo (JP)

( * ) Notice: Subject to any disclaimer, the term of this patent is extended or adjusted under 35 U.S.C. 154(b) by 273 days.

(21) Appl. No.: 14/340,194

(22) Filed: Jul. 24, 2014

(65) Prior Publication Data

US 2014/0333321 A1    Nov. 13, 2014

Related U.S. Application Data

(63) Continuation of application No. PCT/JP2013/059793, filed on Mar. 25, 2013.

(30) Foreign Application Priority Data

Mar. 27, 2012    (JP) .................................. 2012-071552

(51) Int. Cl.
*G01R 31/14*    (2006.01)
*G01R 31/02*    (2006.01)
(Continued)

(52) U.S. Cl.
CPC .............. *G01R 31/14* (2013.01); *B60L 3/0069* (2013.01); *B60L 3/04* (2013.01); *G01R 27/18* (2013.01);
(Continued)

(58) Field of Classification Search
CPC .... G01R 31/00; G01R 31/005; G01R 31/006; G01R 31/02; G01R 31/021; G01R 31/022; G01R 31/024; G01R 31/025; G01R 31/026; G01R 31/083; G01R 31/12; G01R 31/1272; G01R 31/14; G01R 27/02; G01R 27/18; G01R 27/2605; G01N 17/00; G01N 27/82; G01N 27/90; G01N 27/9046; B60L 3/0069; B60L 3/04; B60L 2240/547; B60L 2270/147; G01M 5/0033; H01B 7/328; H04B 3/46
USPC ......... 324/500, 509, 510, 537, 539, 541, 543, 324/544, 551; 361/42
See application file for complete search history.

(56) References Cited

U.S. PATENT DOCUMENTS 8,198,902 B2 *   6/2012   Kawamura ........... G01R 31/025
                                                   324/509
8,232,806 B2 *   7/2012   Kawamura ............ B60L 3/0023
                                                   324/503

(Continued)

FOREIGN PATENT DOCUMENTS

JP    2004-170103 A    6/2004
JP    2004-325382 A    11/2004

(Continued)

OTHER PUBLICATIONS

Chinese Office Action for the related Chinese Patent Application No. 201380010932.8 dated Nov. 2, 2015.

(Continued)

*Primary Examiner* — Hoai-An D Nguyen
(74) *Attorney, Agent, or Firm* — Kenealy Vaidya LLP

(57) ABSTRACT

An insulation state detecting device includes a positive side input terminal connected to a positive side power line of a high voltage DC power supply, a negative side input terminal connected to a negative side power line of the high voltage DC power supply, a ground electrode, a controller that detects insulation states between the positive side power line and the negative side power line and the ground electrode based on a charge voltage of a flying capacitor, and an equilibrium state forming circuit that promotes an operation of transiting a charge state of a positive side electrostatic capacitance between the positive side power line and the ground electrode and a charge state of a negative side electrostatic capacitance between the negative side power line and the ground electrode from non-equilibrium states to equilibrium states.

13 Claims, 3 Drawing Sheets

(51) Int. Cl.
  *G01R 27/18* (2006.01)
  *B60L 3/00* (2006.01)
  *B60L 3/04* (2006.01)
  *G01R 31/00* (2006.01)

(52) U.S. Cl.
  CPC ............ *G01R 31/021* (2013.01); *G01R 31/025* (2013.01); *B60L 2240/547* (2013.01); *B60L 2270/147* (2013.01); *G01R 31/006* (2013.01)

(56) References Cited

U.S. PATENT DOCUMENTS

| | | | | |
|---|---|---|---|---|
| 8,860,426 | B2* | 10/2014 | Kawamura | G01R 27/18 324/509 |
| 9,199,539 | B2* | 12/2015 | Iwanabe | G01R 31/025 |
| 2008/0079404 | A1 | 4/2008 | Hayakawa et al. | |
| 2009/0289639 | A1 | 11/2009 | Kawamura et al. | |
| 2009/0289640 | A1 | 11/2009 | Kawamura et al. | |
| 2011/0012606 | A1 | 1/2011 | Kawamura | |
| 2013/0082715 | A1 | 4/2013 | Kawamura | |

FOREIGN PATENT DOCUMENTS

| | | |
|---|---|---|
| JP | 2011-21990 A | 2/2011 |
| WO | 2012/023595 A1 | 2/2012 |

OTHER PUBLICATIONS

Japanese Office Action for the related Japanese Patent Application No. 2012-071552 dated Nov. 4, 2015.
Chinese Office Action for the related Chinese Patent Application No. 201380010932.8 dated May 16, 2016.
International Search Report and Written Opinion of the International Search Report for PCT/JP2013/059793 dated Jul. 23, 2013.

* cited by examiner

INSULATION STATE DETECTING DEVICE

CROSS REFERENCE TO RELATED APPLICATIONS

This application is a continuation of PCT application No. PCT/JP2013/059793, which was filed on Mar. 25, 2013 based on Japanese Patent Application (No. JP-2012-071552) filed on Mar. 27, 2012, the contents of which are incorporated herein by reference.

BACKGROUND OF THE INVENTION

1. Field of the Invention

This present disclosure relates to an insulation state detecting device using a flying capacitor.

2. Description of the Related Art

For example, a vehicle that uses electrical power as energy for driving such as an electric car may be provided with a DC power supply device which outputs a high voltage of around 200V. The vehicle provided with the DC power supply device of such a high voltage is used when the positive and negative power lines of the DC power supply device are electrically insulated from the vehicle body. That is, the vehicle body is not used as the ground of the power source for outputting high voltage power.

In such a vehicle, to ensure safety, it is necessary to check to ensure that the wires for the DC power supply output of the high voltage are sufficiently insulated from the vehicle body. Related techniques of insulation state detecting devices for checking in the above situation are known as JP-B-3962990 and JP-A-2011-21990.

This kind of insulation state detecting devices use a flying capacitor. That is, through a switching element, a detecting capacitor (referred to as the flying capacitor) is connected between the positive and negative power lines for the high voltage and a ground electrode (the vehicle body) only for a predetermined time. The charge voltage of the flying capacitor is monitored, and ground fault resistances, namely, the insulation resistances between the power lines and the ground electrode are calculated from the charge voltage.

To remove the high frequency noise of the power supply, and to stabilize operations of the power supply, capacitors called Y capacitors (line bypass capacitors) are often connected between the positive and negative power lines for the high voltage and the ground electrode (in JP-A-2011-21990).

SUMMARY OF THE INVENTION

The electric current and the electric voltage of the insulation state detecting device of the flying capacitor type when the detecting capacitor is charged are affected by the Y capacitors. Even if the Y capacitors are not exist, the charge current and voltage of the detecting capacitor are changed under the influence of existing stray capacitance between the wires of the DC power supply output of the high voltage and the vehicle body. The specific influence of the Y capacitor is described below.

The related circuit which is equivalent to the insulation state detecting device disclosed in JP-A-2011-21990 is shown in FIG. 3. As shown in FIG. 3, a positive side Y capacitor 101 is connected between a positive side power line 111 for the high voltage and a ground electrode 103. A negative side Y capacitor 102 is connected between a negative side power line 112 for the high voltage and the ground electrode 103. The insulation state between the positive side power line 111 and the ground electrode 103 is expressed as a ground fault resistance (RL+), and the insulation state between the negative side power line 112 and the ground electrode 103 is expressed as a ground fault resistance (RL−).

A detecting capacitor (flying capacitor) 120 is provided in the insulation state detecting device 100. Switching elements S1 to S5 are provided in the insulation state detecting device 100 to control charge states of the detecting capacitor 120. A microcomputer 121 controls to open and close the switching elements S1 to S5 for controlling the charge states of the detecting capacitor 120. The microcomputer 121 monitors the charged voltage of the detecting capacitor 120 to grasp the ground fault resistances (RL+, RL−).

In a state that a change is not applied from the outside, after electricity is charged to the Y capacitors 101 and 102 so as to reach a balance state to be decided by the voltage ratio of the ground fault resistances (RL+, RL−), the Y capacitors 101 and 102 enter a stable state. That is, the amounts of electricity charged to the Y capacitors 101 and 102 do not change.

However, because the switching elements S1 to S4 open and close when the ground fault resistances are measured with the insulation state detecting device 100, the balance of the Y capacitors 101 and 102 collapses accordingly. That is, the Y capacitors 101 and 102 will be repeatedly charged and discharged, and the charged electricities fluctuate.

However, in the insulation state detecting device 100 as shown in FIG. 3, the ground fault resistances are measured by assuming that the Y capacitors 101 and 102 are basically in a balance state. Therefore, since the ground fault resistances are measured actually when the balance of the Y capacitors 101 and 102 collapsed, and the detection precision of the ground fault resistances decreases.

In particular, a drop of the detection precision becomes remarkable when the ground fault resistances to be detected are high. When the electrostatic capacitances of the Y capacitors 101 and 102 are smaller than that of the detecting capacitor 120, the influence of the Y capacitors 101 and 102 is relatively small. However, the influence cannot be ignored when the electrostatic capacitances of the Y capacitors 101 and 102 are large.

Therefore, when the Y capacitors of relatively large capacitances are connected to the high voltage power supply, the insulation state detecting device cannot be used. Alternatively, it is necessary to measure after waiting until the state of the Y capacitors returns to a balance state after the opening and closing of the switching elements are changed. Therefore, not only it cannot be avoided that the time required for measurement gets longer and a steep change of the situation cannot be coped with, but also the measurement can only be performed in a non-real-time way.

The present disclosure is made in view of the above circumstances, and the object of the present disclosure is to provide an insulation state detecting device so that even if Y capacitors in which large capacities are accumulated are connected to the high voltage power supply, a measurement of high precision is possible in a short required time.

To achieve the above object, the insulation state detecting devices according to the present disclosure are featured in the following (1) to (8).

(1) An insulation state detecting device comprises:
 a positive side input terminal connected to a positive side power line of a high voltage DC power supply;
 a negative side input terminal connected to a negative side power line of the high voltage DC power supply;
 a ground electrode;
 a controller that detects insulation states between the positive side power line and the negative side power line and the ground electrode based on a charge voltage of a flying capacitor; and an equilibrium state forming circuit that promotes an operation of transiting a charge state of a positive side electrostatic capacitance between the positive side power line and the ground electrode and a charge state of a negative side electrostatic capacitance between the negative side power line and the ground electrode from non-equilibrium states to equilibrium states.

(2) For example, the equilibrium state forming circuit includes, control resistors which are connected to the positive side power line and the negative side power line respectively, and resistance values of the control resistors being much smaller than resistance values of ground fault resistances to be detected, and control switches adapted to be opened and closed to temporarily connect the control resistors to electrodes having constant electric potentials according to control signals.

(3) For example, the equilibrium state forming circuit includes a positive side control resistor having one end which is connected to the positive side power line, an negative side control resistor having one end which is connected to the negative side power line, and control switches adapted to be opened and closed to temporarily connect the other end of the positive side control resistor and the other end of the negative side control resistor to the ground electrode according to control signals, a resistance value of the positive side control resistor is larger than a value for which an instant drop of insulation state is permitted when the control switches are closed and is much smaller than resistance values of ground fault resistances to be detected, and the resistance value of the negative side control resistor is larger than a value for which an instant drop of insulation state is permitted when the control switches are closed and is much smaller than resistance values of the ground fault resistances to be detected.

(4) For example, the insulation state detecting device further comprises a control signal generator that automatically generates timings of the control signals, which are given to the control switches, in synchronous with the change of a control cycle of charging and discharging of the flying capacitor.

(5) For example, the control signal generator includes selecting switches which change generation conditions of the control signals.

(6) For example, the insulation state detecting device further comprises a positive side Y condenser connected between the positive side power line and the ground electrode, and a negative side Y condenser connected between the negative side power line and the ground electrode, and the control signal generator automatically generates the timings of the control signals based on a relation between the control timings of the control switches and sizes of electrostatic capacitances of the positive side Y condenser and the negative side Y condenser.

(7) For example, the control signal generator generates the control signals to close the control switches in synchronous with timings in which the flying capacitor is charged with a course which does not pass through both of a positive side ground fault resistance formed between the positive side input terminal and the ground electrode and a negative side ground fault resistance formed between the negative side input terminal and the ground electrode.

(8) For example, the insulation state detecting device further comprises a control signal generator that generates the control signals to close the control switches except timings in which the flying capacitor is charged with a course which passes through a positive side ground fault resistance formed between the positive side input terminal and the ground electrode or a negative side ground fault resistance formed between the negative side input terminal and the ground electrode.

According to the insulation state detecting device of the present disclosure, even if Y capacitors in which large capacities are accumulated are connected to a high voltage power supply, a measurement of high precision can be achieved in a short required time.

The present disclosure is described in brief above. Further, details of the disclosure will become more apparent after the embodiments of the invention described below are read with reference to the accompanying figures.

DETAILED DESCRIPTION OF THE EXEMPLARY EMBODIMENTS

The specific embodiment about the insulation state detecting device of the present disclosure is described below with reference to the figures.

<Construction of the Device>

Figure 1:
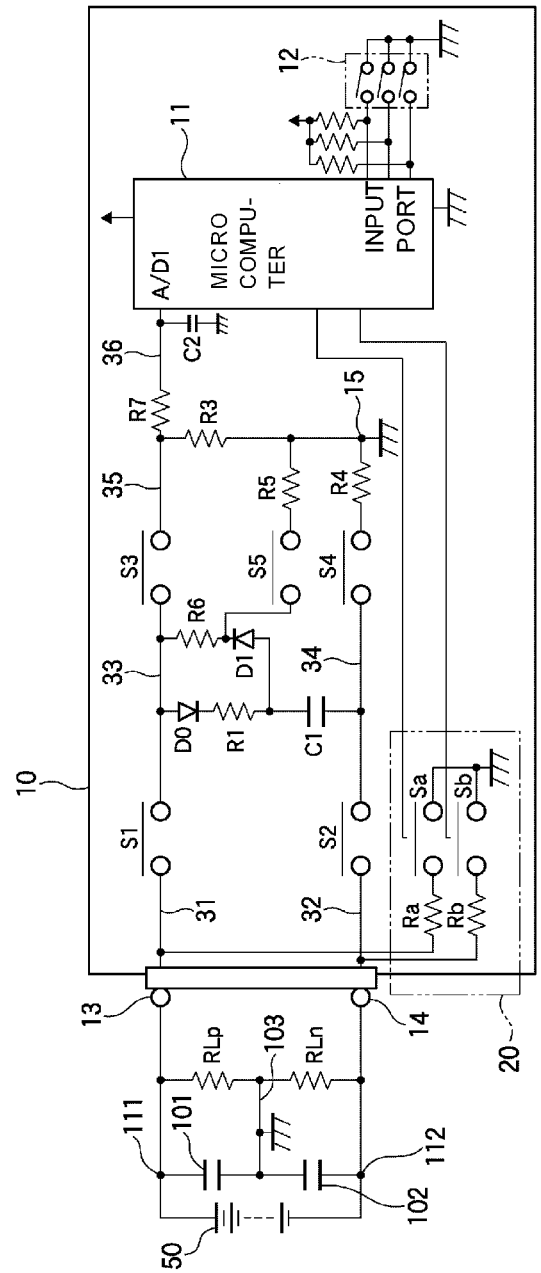
FIG. 1 is an electric circuit diagram which shows a construction example of the insulation state detecting device of an embodiment.

The construction and a connection example at the time of measurement of an insulation state detecting device 10 according to the present embodiment are shown in FIG. 1. A direct current high voltage power supply 50 shown in FIG. 1 is mounted in a vehicle such as an electric car, and outputs direct current power of a high voltage of around 200V.

A positive side power line 111 connected to a positive side of the direct current high voltage power supply 50 is electrically insulated from a ground electrode 103. A negative side power line 112 is also electrically insulated from the ground electrode 103. The ground electrode 103 is equivalent to a ground portion such as the body of the vehicle. An insulation state between the positive side power line 111 and the ground electrode 103 is expressed as the electrical resistance of a ground fault resistor RLp. An insulation state between the negative side power line 112 and the ground electrode 103 is expressed as the electrical resistance of a ground fault resistor RLn.

To reduce common mode noise, a Y capacitor 101 is connected between the positive side power line 111 and the ground electrode 103, and a Y capacitor 102 is connected between the negative side power line 112 and the ground electrode 103.

The insulation state detecting device 10 is used to detect the ground fault resistors RLp and RLn at the output of the direct current high voltage power supply 50, and grasp the insulation state. When the ground fault resistors RLp and RLn are detected, as shown in FIG. 1, a positive side input terminal 13 and a negative side input terminal 14 of the insulation state detecting device 10 are connected to the positive side power line 111 and the negative side power line 112, respectively. A ground electrode 15 of the insulation state detecting device 10 is connected to the ground electrode 103.

As shown in FIG. 1, a detecting capacitor C1 operating as a flying capacitor is arranged in the circuit of the insulation state detecting device 10. Five switching elements S1 to S5 are provided around the detecting capacitor C1 to control the charging and discharging of the detecting capacitor C1. For example, each of these switching elements S1 to S5 is a switch such as a photo MOSFET which can switch between an opened state and a closed state (off/on) of contacts by controlling an insulated signal.

One end of the switching element S1 is connected to the positive side input terminal 13 through a wiring 31, and the other end of the switching element S1 is connected to a wiring 33. One end of the switching element S2 is connected to the negative side input terminal 14 through a wiring 32, and the other end of the switching element S1 is connected to a wiring 34.

One end of the switching element S3 is connected to the wiring 33, and the other end of the switching element S3 is connected to a wiring 35. One end of the switching element S4 is connected to the wiring 34, and the other end of the switching element S3 is connected to the ground electrode 15 through a resistor R4.

The negative side terminal of the detecting capacitor C1 is connected to the wiring 34. The positive side terminal of the detecting capacitor C1 is connected to the wiring 33 through a series circuit which includes a diode D0 and a resistor R1. The positive side terminal of the detecting capacitor C1 is connected to the wiring 33 through a series circuit which includes a diode D1 and a resistor R6.

One end of the switching element S5 is connected to the cathode of the diode D1, and the other end of the switching element S3 is connected to the ground electrode 15 through a resistance R5. The wiring 35 is connected to the ground electrode 15 through a resistor R3.

An equilibrium state forming circuit 20 is provided in the insulation state detecting device 10. The equilibrium state forming circuit 20 is used to promote an operation of transiting the mutual relation between a charge state of the positive side Y capacitor 101 and the charge state of the negative side Y capacitor 102 from a non-equilibrium state to an equilibrium state. The term "equilibrium state" means a peculiar stable state to be decided by the voltage ratio of the series circuit of the ground fault resistor RLp and the ground fault resistor RLn.

The equilibrium state forming circuit 20 shown in FIG. 1 includes control resistors Ra and Rb and control switches Sa and Sb. One end of the control resistor Ra is connected to the wiring 31, and the other end of the control resistor Ra is connected to the ground electrode through the contacts of the control switch Sa. One end of the control resistor Rb is connected to the wiring 32, and the other end of the control resistor Ra is connected to the ground electrode through the contacts of the control switch Sb. For example, each of these control switches Sa and Sb is a switch such as a photo MOSFET which can switch between an opened state and a closed state (off/on) of contacts by controlling an insulated signal.

The resistance values of the control resistors Ra and Rb are determined to such a size that the resistance values are larger than a value for which the instant drop of the insulation state is permitted when the control switches Sa and Sb are closed and are much smaller than the assumed resistance values of the ground fault resistors RLp and RLn, and also an unreasonably large electric current will not flow to the control resistors Ra and Rb. In particular, it is assumed that the resistance values of the control resistors Ra and Rb are set around 100 kΩ to 1 mΩ. In the present embodiment, resistors of the same resistance value are used for the control resistors Ra and Rb.

A microcomputer 11 performs various controls to be required for the insulation state detecting device 10 by executing a program incorporated beforehand. In particular, the microcomputer 11 controls the switching elements S1 to S5 individually to control the charging and discharging of the detecting capacitor C1. An analog level corresponding to the charge voltage of the detecting capacitor C1 is input to the microcomputer 11 from a wiring 36, and the microcomputer 11 calculates based on this input level and grasps the ground fault resistor RLp and RLn. The microcomputer 11 switches on/off the control switches Sa and Sb in synchronous with switching timings of the switching elements S1 to S5.

A plurality of selecting switches 12 are connected to input ports of the microcomputer 11. The states of these selecting switches 12 can be changed by input operations of a user. The selection states of the selecting switches 12 can be used to select operation modes or the like of the insulation state detecting device 10. For example, the selection states of the selecting switches can be used for on/off switching related to the use of the equilibrium state forming circuit 20, parameter switching in accordance with the electrostatic capacitance sizes of the Y capacitors 101 and 102, and the like. The microcomputer 11 can reflect parameters corresponding to selection states of the selecting switches 12 to the switchings of the control timings of the switching elements S1 to S5 and the control switches Sa and Sb.

A map representing a correspondence between control timings of the switching elements S1 to S5 and the control switches Sa and Sb and the electrostatic capacitance sizes of the Y capacitors 101, 102 may be stored as a data table in an internal memory of the microcomputer 11.

<Operations of the Device>
<An Example of Operation Timings>

Figure 2:
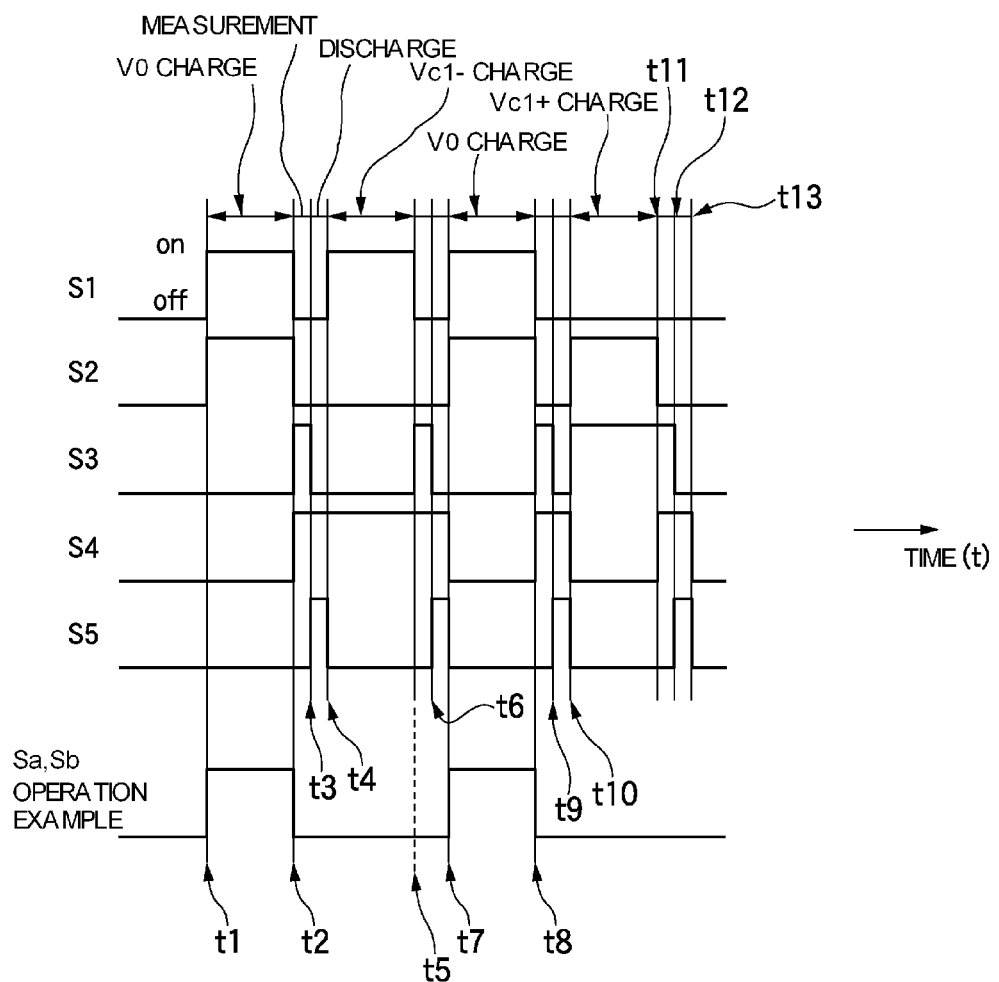
FIG. 2 is a time chart which shows an operation example of the insulation state detecting device of FIG. 1.
Figure 3:
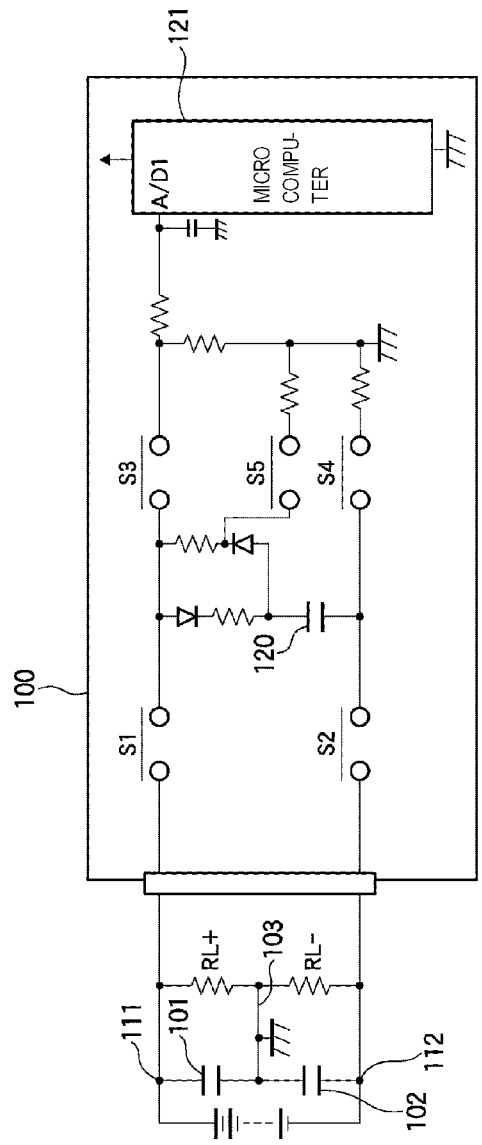
FIG. 3 is an electric circuit diagram which shows an insulation state detecting device of a related technique.

An example of operation timings in the insulation state detecting device 10 of FIG. 1 is shown in FIG. 2. In FIG. 2, ON/OFF operations of the switching elements S1 to S5 and the control switches Sa and Sb in a basic measurement cycle necessary for one basic measurement are shown.

The basic measurement cycle is constructed, as shown in FIG. 2, of a series of sections of "V0 charge", "measurement", "discharge", "Vc1− charge", "measurement", "discharge", "V0 charge", "measurement", "discharge", "Vc1+ charge", "measurement" and "discharge".

In the "V0 charge" section of timings t1 to t2, the switching elements S1 and S2 and the control switches Sa and Sb are turned on (contacts are closed) and other switching elements are turned off (contacts are opened).

In the "measurement" section of timings t2 to t3, the switching elements S3 and S4 are turned on and other switching elements and the control switches Sa and Sb are turned off.

In the "discharge" section of timings t3 to t4, the switching elements S4 and S5 are turned on, and other switching elements and the control switches Sa and Sb are turned off.

In the "Vc1− charge" section of timings t4 to t5, the switching elements S1 and S4 are turned on, and other switching elements and the control switches Sa and Sb are turned off.

The "measurement" section of timings t5 to t6 is similar to the "measurement" section of timings t2 to t3. The "discharge" section of timings t6 to t7 is similar to the "discharge" section of timings t3 to t4. The "V0 charge" section of timings t7 to t8 is similar to the "V0 charge" section of timings t1 to t2. The "measurement" section of timing t8 to t9 is similar to the "measurement" section of timings t2 to t3. The "discharge" section of timing t9 to t10 is similar to the "discharge" section of timings t3 to t4.

In the "Vc1+ charge" section of timings t10 to t11, the switching elements S2 and S3 are turned on, and other switching elements and the control switches Sa and Sb are turned off.

The "measurement" section of timings t11 to t12 is similar to the "measurement" section of timings t2 to t3. The "discharge" section of timings t12 to t13 is similar to the "discharge" section of timings t3 to t4.

<Electrified Courses and Operations in the Sections of the Measurement Cycle>

The "V0 Charge" Section:

Because the contacts of the switching element S1 are closed, an electric current flows from the positive side power line 111 to the positive side terminal of the detecting capacitor C1 through the positive side input terminal 13, the wiring 31, the switching element S1, the diode D0 and the resistor R1. Because the contacts of the switching element S2 are closed, the electric current flows from the negative side terminal of the detecting capacitor C1 to the wiring 34, the switching element S2, the wiring 32, the negative side input terminal 14 and the negative side power line 112. Therefore, electricity is charged in the detecting capacitor C1 by this electric current.

Because the contacts of the control switch Sa are closed, the positive side input terminal 13 is connected to the ground electrode 15 through the control resistor Ra and the control switch Sa. Because the contacts of the control switch Sb are closed, the negative side input terminal 14 is connected to the ground electrode 15 through the control resistor Rb and the control switch Sb.

In this situation, due to the currents flowing through the control resistors Ra and Rb, the charge state of the Y condenser 101 and the charge state of the Y condenser 102 change to become closer to the equilibrium state to be decided by the voltage ratio of the series circuit of the control resistors Ra and Rb. That is, the transition from a non-equilibrium state to the equilibrium state is promoted.

The "Measurement" Section:

Because the contacts of the switching element S4 are closed, the negative side terminal of the detecting capacitor C1 is connected to the ground electrode 15 through the resistor R4. Because the contacts of the switching element S3 are closed, the positive side terminal of the detecting capacitor C1 is connected to an analog input port of the microcomputer 11 through the diode D1, the resistor R6, the switching element S3, the wiring 35, a resistor R7 and the wiring 36. Therefore, the microcomputer 11 can detect an analog level proportional to the charge voltage of the detecting capacitor C1.

The "Discharge" Section:

Because the contacts of the switching element S4 are closed, the negative side terminal of the detecting capacitor C1 is connected to the ground electrode 15 through the resistor R4. Because the contacts of the switching element S5 are closed, the positive side terminal of the detecting capacitor C1 is connected to the ground electrode 15 through the diode D1, the switching element S5 and a resistor R5. Therefore, the electricity accumulated in the detecting capacitor C1 discharges.

The "Vc1− Charge" Section:

Because the contacts of the switching element S1 are closed, an electric current flows from the positive side power line 111 to the positive side terminal of the detecting capacitor C1 through the positive side input terminal 13, the wiring 31, the switching element S1, the diode D0 and the resistor R1. Because the contacts of the switching element S4 are closed, the electric current flows from the negative side terminal of the detecting capacitor C1 to the negative side power line 112 through the switching element S4, the resistor R4, the ground electrode 15, the ground electrode 103 and the ground fault resistor RLn. Electricity is charged in the detecting capacitor C1 by this electric current. The charge voltage at this time reflects the influence of the ground fault resistor RLn.

The "Vc1+ Charge" Section:

Because the contacts of the switching element S3 are closed, an electric current flows from the positive side power line 111 to the positive side terminal of the detecting capacitor C1 through the ground fault resistor RLp, the ground electrode 103, the ground electrode 15, the resistor R3, the switching element S3, the diode D0 and the resistor R1. Because the contacts of the switching element S2 are closed, the electric current flows from the negative side terminal of the detecting capacitor C1 to the wiring 34, the switching element S2, the wiring 32, the negative side input terminal 14 and the negative side power line 112. Electricity is charged in the detecting capacitor C1 by this electric current. The charge voltage at this time reflects the influence of the ground fault resistance RLp.

However, because in the "Vc1− charge" section and the "Vc1+ charge" section, an electric current will flow to only one of the ground fault resistors RLn and RLp, the equilibrium state of the charge state of the Y condenser 101 and the charge state of the Y condenser 102 collapses and becomes a non-equilibrium state. The equilibrium state forming circuit 20 is used to promote the operation of returning to the equilibrium state from such a non-equilibrium state.

<Measurement of the Ground Fault Resistances>

For the operations of the insulation state detecting device 10 shown in FIG. 1, the following expression is established:

$$(RLp+RLn)/(RLp \times RLn) = \{(Vc1+)+(Vc1-)\}/Vc1,$$

wherein

Vc1: the charge voltage of the detecting capacitor C1 depending on the output voltage of the direct current high voltage power supply 50, Vc1−: the charge voltage of the detecting capacitor C1 affected by the ground fault resistor RLn of the negative side, Vc1+: the charge voltage of the detecting capacitor C1 affected by the ground fault resistor RLp of the positive side, and RLp, RLn: the resistance values of the ground fault resistors.

Therefore, the microcomputer 11 can grasp the charge voltages "Vc1", "Vc1−" and "Vc1+" from signal levels input into the analog input port (A/D1) in the states, and calculate the ground fault resistors RLp and RLn based on the above expression.

On the other hand, the Y capacitors 101 and 102 connected to the direct current high voltage power supply 50 are charged by the electric current which is output from the direct current high voltage power supply 50. The charge states of the Y capacitors 101 and 102 are stabilized in a steady state and do not change.

However, in the "Vc1− charge" section, the charged electricity of the positive side Y condenser 101 is discharged, and the electricity including this discharged electricity is charged in the detecting capacitor C1. In addition, in the "Vc1+ charge" section, the charge electricity of the Y condenser 102 of the negative side is discharged, and the electricity including this discharge electricity is charged in the detecting capacitor C1.

Therefore, the charge voltages "Vc1−" and "Vc1+" detected by the microcomputer 11 include the influence of the charge electricity discharged by the Y capacitors 101 and 102. That is, the detected charge voltages "Vc1−" and "Vc1+" become high values because of the charge part of the charge electricity discharged by the Y capacitors 101 and 102. Therefore, when the above expression and measured values of the charge voltages are just used to calculate the ground fault resistors RLp and RLn, an offset value, which is lower than the actual resistance values, is calculated.

Therefore, the microcomputer 11 subtracts the voltage of the charge part due to the discharge electricity of the positive side Y condenser 101 from the charge voltage "Vc1-" measured as a value depending on the ground fault resistor RLn of the negative side, and calculates the subtracted value as a true value of the charge voltage "Vc1-". In addition, the microcomputer 11 subtracts the voltage of the charge part due to the discharge electricity of the negative side Y condenser 102 from the charge voltage "Vc1+" measured as a value depending on the positive side ground fault resistor RLp, and calculates the subtracted value as a true value of the charge voltage "Vc1+".

The microcomputer 11 calculates the ground fault resistors RLp and RLn based on the detected charge voltage "Vc1", the calculated true value of "Vc1-", the calculated true value of "Vc1+" and the above expression. The change of the charge voltages "Vc1-" and "Vc1+" due to the discharge electricities of the Y capacitors 101 and 102 can be calculated if the electrostatic capacitances of the Y capacitors 101 and 102 are grasped.

<Influence of the Equilibrium State Forming Circuit 20>

In the "Vc1- charge" section and "Vc1+ charge" section, because the charge electricity of one of the Y capacitors 101 and 102 is discharged to charge the detecting capacitor C1, the charge states of the Y capacitors 101 and 102 change from the equilibrium state (steady state) into a non-equilibrium state. When the "Vc1- charge" section or the "Vc1+ charge" section is finished, because the discharge from the Y condenser 101 or 102 is finished, if some time passes after that, the charge states of the Y capacitors 101 and 102 can return to the equilibrium state to be decided by these voltage ratios under the influence of the ground fault resistors RLp and RLn.

However, because the resistance values of the ground fault resistors RLp and RLn are usually very large, it takes a long time for the charge states of the Y capacitors 101 and 102 to return from a non-equilibrium state to the equilibrium state. If the next "measurement" section comes before the charge states of the Y capacitors 101 and 102 return to the equilibrium state, the charge voltage including an error will be detected, and a big error in the calculated resistance values of the ground fault resistors RLp and RLn may occur.

Because the resistance values of the control resistors Ra and Rb in the equilibrium state forming circuit 20 are larger than a value for which the instant drop of the insulation state is permitted when the control switches Sa and Sb are closed and are much smaller than the resistance values of the ground fault resistors RLp and RLn, when the control switches Sa and Sb are closed, a large influence can be given. That is, a relatively large electric current can flow so that the charge states of the Y capacitors 101 and 102 become the stable state to be decided by the voltage ratio of the control resistors Ra and Rb. That is, the course of the electric current to promote the operation of returning charge states of the Y capacitors 101 and 102 to the above-mentioned equilibrium state can be secured.

Therefore, the charge states of the Y capacitors 101 and 102 return to the equilibrium state from a non-equilibrium state in a short time. Therefore, even if the time of the above-mentioned measurement cycle is not lengthened, the influence of the Y capacitors 101 and 102 can be removed, and the resistance values of the ground fault resistors RLp and RLn can be detected precisely in a wide range of resistance values.

By closing the contacts of the control switches Sa and Sb in synchronous with the "V0 charge" section as shown in FIG. 2, the charge states of the Y capacitors 101 and 102 can return to the equilibrium state without affecting the charge voltage of the detecting capacitor C1.

<Possibility of Variations>

<Control Timings of the Equilibrium State Forming Circuit 20>

In the control example shown in FIG. 2, the opening and closing of the control switches Sa and Sb are changed at the same timing. However, it is possible to open and close the control switches Sa and Sb individually at independent timings. It is also possible that the time length in which the contacts of the control switches Sa and Sb are closed and/or the timings to change the opening and closing, can be finely adjusted depending on the situation at that time.

Furthermore, in the control example shown in FIG. 2, the opening and closing of the control switches Sa and Sb are changed at the same timing. However, the present disclosure is not limited to the change at the timing. For example, control signals may be produced to close the control switches (Sa, Sb) other than the timing to charge the flying capacitor (C1).

For example, by changing of the selecting switches 12 shown in FIG. 1, parameters suitable for the electrostatic capacitances of the Y capacitors 101 and 102 may be selected, and control timings may change according to the parameters. That is, it is possible that the time length in which the contacts of the control switches Sa and Sb are closed and/or the timings to change the opening and closing can be changed, and the whole time length of a measurement cycle can be changed accordingly.

<Connection Form of the Equilibrium State Forming Circuit 20>

In the equilibrium state forming circuit 20 shown in FIG. 1, one end of each of the control switches Sa and Sb is connected to the ground electrode 15 directly. However, the control switches Sa and Sb may be connected to an electrode except the ground electrode 15 if the electric potential of the electrode is constant. It is also possible that the control switches Sa and Sb are connected through, for example, a capacitor to interrupt a direct current.

SUMMARY (1) As shown in FIG. 1, the insulation state detecting device 10 includes the positive side input terminal (13) connected to the positive side power line (111) of the high voltage DC power supply, the negative side input terminal (14) connected to the negative side power line (112) of the high voltage DC power supply and the ground electrode (15). The insulation state detecting device 10 is an insulation state detecting device to grasp the insulation states between the positive side power line and the negative side power line and the ground electrode based on the charge voltage of the flying capacitor (C1), and includes the equilibrium state forming circuit (20) which promotes the operations of transiting the charge state of the positive side electrostatic capacitance (101) between the positive side power line and the ground electrode and the charge state of the negative side electrostatic capacitance (102) between the negative side power line and the ground electrode from a non-equilibrium state to the equilibrium states.

(2) As shown in FIG. 1, the equilibrium state forming circuit (20) includes the control resistors (Ra, Rb) which are connected to the positive side power line and the negative side power line, and whose resistance values are much smaller than the ground fault resistances (RLp, RLn) to be detected, and the control switches (Sa, Sb) which can be opened and closed to temporarily connect the electric potentials of the control resistors to the predetermined electrodes according to the predetermined control signals.

(3) As shown in FIG. 2, the microcomputer 11, which is a control signal generating part, automatically generates the timings of the control signals, which are given to the control switches (Sa, Sb), in synchronous with the change of the control cycle of the charging and discharging of the flying capacitor.

(4) As shown in FIG. 1, the microcomputer 11, which is a control signal generating part, includes the selecting switches (12) which change the generation conditions of the control signals.

(5) As shown in FIG. 1, the equilibrium state forming circuit (20) includes the positive side control resistor (Ra) whose one end is connected to the positive side power line, and whose resistance value is larger than a value for which the instant drop of the insulation state is permitted when the control switches (Sa, Sb) are closed and is much smaller than the ground fault resistances to be detected, the negative side control resistor (Rb) whose one end is connected to the negative side power line, and whose resistance value is larger than a value for which the instant drop of the insulation state is permitted when the control switches (Sa, Sb) are closed and is much smaller than the ground fault resistances to be detected, and the control switches (Sa, Sb) which can be opened and closed to temporarily connect the other end of the positive side control resistor and the other end of the negative side control resistor to the ground electrode according to the predetermined control signals.

(6) As shown in FIG. 1, the Y condenser (101) of the positive side connected between the positive side power line (111) and the ground electrode (103) and the Y condenser (102) of the negative side connected between the negative side power line (112) and the ground electrode (103) are included, and the microcomputer 11, which is a control signal generating part, automatically generates the timings of the control signals based on the correspondence between the control timings of the control switches (Sa, Sb) and the sizes of the electrostatic capacitances of the Y condenser (101) of the positive side and the Y condenser (102) of the negative side.

(7) As shown in FIG. 2, the microcomputer 11, which is a control signal generating part, generates the control signals to close the control switches (Sa, Sb) in synchronous with the timings (t1 to t2 and t7 to t8) in which the flying capacitor (C1) is charged with a course that does not go along both of the positive side ground fault resistance (RLp) formed between the positive side input terminal and the ground electrode and the negative side ground fault resistance (RLn) formed between the negative side input terminal and the ground electrode.

(8) The microcomputer 11, which is a control signal generating part, generates the control signals to close the control switches (Sa, Sb) except the timings in which the flying capacitor (C1) is charged in the course that goes along of the positive side ground fault resistance (RLp) formed between the positive side input terminal and the ground electrode and the negative side ground fault resistance (RLn) formed between the negative side input terminal and the ground electrode.

According to the insulation state detecting device of the construction of the above (1), when the charge state of the positive side capacitance (equivalent to the Y capacitor) and the charge state of the negative side capacitance are in a non-equilibrium state, the charge states can quickly return to the equilibrium state by using the equilibrium state forming circuit. Therefore, the measurement can be performed in the equilibrium state even without waiting for a long time, and a measurement of high precision is possible.

According to the insulation state detecting device of the construction of the above (2), by closing the control switches, electric current flow through the control resistors and it is possible to return to the equilibrium state in a short time.

According to the insulation state detecting device of the construction of the above (3), the charging and discharging of the Y capacitor of the positive side can be controlled through the positive side control resistor, and the charging and discharging of the Y capacitor of the negative side can be controlled through the negative side control resistor.

According to the insulation state detecting device of the construction of the above (4), the control switches can be opened and closed at appropriate timings. That is, it is possible to return to the equilibrium state before a measurement is started without adversely affecting the charging and discharging of the flying capacitor.

According to the insulation state detecting device of the construction of the above (5), an appropriate condition to produce the control signals can be changed by the input operation of a user.

According to the insulation state detecting device of the construction of the above (6), the control signals can be generated on appropriate conditions depending on the situation. For example, when the capacitances of the Y capacitors are relatively large, the time to close the control switches is lengthened, and a measurement can be performed after waiting until the states return to the equilibrium state surely.

According to the insulation state detecting device of the construction of the above (7), it is possible to return from a non-equilibrium state to the equilibrium state without adversely affecting the charge of the flying capacitor.

According to the insulation state detecting device of the construction of the above (8), it is possible to return from a non-equilibrium state to the equilibrium state without adversely affecting the charge of the flying capacitor.

According to the insulation state detecting device of the present disclosure, even if Y capacitors in which large capacities are accumulated are connected to a high voltage power supply, a measurement of high precision can be achieved in a short required time.

REFERENCE SIGNS LIST 10 insulation state detecting device
11 microcomputer
12 selecting switches
13 positive side input terminal
14 negative side input terminal
15 ground electrode
20 equilibrium state forming circuit
31-36 wiring
50 voltage power supply
101 Y capacitors
102 Y capacitors
103 ground electrode
111 positive side power line
112 negative side power line
C1 detecting capacitor (flying capacitor)
C2 capacitor
D0, D1 diode
R1, R3, R4, R5, R6, R7 resistor
Ra control resistor (positive side control resistor)
Rb control resistor (negative side control resistor)
RLp ground fault resistor (positive side ground fault resistor)
RLn ground fault resistor (negative side ground fault resistor)
S1, S2, S3, S4, S5 switching elements
Sa, Sb control switches

What is claimed is:

1. An insulation state detecting device comprising:
a positive side input terminal connected to a positive side power line of a high voltage DC power supply;
a negative side input terminal connected to a negative side power line of the high voltage DC power supply;
a ground electrode;
a controller that detects insulation states between the positive side power line and the negative side power line and the ground electrode based on a charge voltage of a flying capacitor; and
an equilibrium state forming circuit that promotes an operation of transiting a charge state of an electrostatic capacitance of a positive side capacitor between the positive side power line and the ground electrode and a charge state of an electrostatic capacitance of a negative side capacitor between the negative side power line and the ground electrode from non-equilibrium states to equilibrium states,
wherein in the non-equilibrium states, amounts of electricity charges on the positive side capacitor and the negative side capacitor fluctuate; and
wherein in the equilibrium states, the amounts of electricity charges on the positive side capacitor and the negative side capacitor are not changed.

2. The insulation state detecting device according to claim 1, wherein the equilibrium state forming circuit includes:
control resistors which are connected to the positive side power line and the negative side power line respectively, and resistance values of the control resistors being much smaller than resistance values of ground fault resistances to be detected; and
control switches adapted to be opened and closed to temporarily connect the control resistors to electrodes having constant electric potentials according to control signals.

3. The insulation state detecting device according to claim 1, wherein the equilibrium state forming circuit includes:
a positive side control resistor having one end which is connected to the positive side power line:
a negative side control resistor having one end which is connected to the negative side power line: and
control switches adapted to be opened and closed to temporarily connect the other end of the positive side control resistor and the other end of the negative side control resistor to the ground electrode according to control signals;
wherein a resistance value of the positive side control resistor is larger than a value for which an instant drop of insulation state is permitted when the control switches are closed and is much smaller than resistance values of ground fault resistances to be detected; and
wherein the resistance value of the negative side control resistor is larger than a value for which an instant drop of insulation state is permitted when the control switches are closed and is much smaller than resistance values of the ground fault resistances to be detected.

4. The insulation state detecting device according to claim 2, further comprising:
a control signal generator that automatically generates timings of the control signals, which are given to the control switches, in synchronous with the change of a control cycle of charging and discharging of the flying capacitor.

5. The insulation state detecting device according to claim 4, wherein the control signal generator includes selecting switches which change generation conditions of the control signals.

6. The insulation state detecting device according to claim 4, further comprising:
a positive side Y condenser connected between the positive side power line and the ground electrode; and
a negative side Y condenser connected between the negative side power line and the ground electrode,
wherein the control signal generator automatically generates the timings of the control signals based on a relation between the control timings of the control switches and sizes of electrostatic capacitances of the positive side Y condenser and the negative side Y condenser.

7. The insulation state detecting device according to claim 4, wherein the control signal generator generates the control signals to close the control switches in synchronous with timings in which the flying capacitor is charged with a course which does not pass through both of a positive side ground fault resistance formed between the positive side input terminal and the ground electrode and a negative side ground fault resistance formed between the negative side input terminal and the ground electrode.

8. The insulation state detecting device according to claim 2, further comprising:
a control signal generator that generates the control signals to close the control switches except timings in which the flying capacitor is charged with a course which passes through a positive side ground fault resistance formed between the positive side input terminal and the ground electrode or a negative side ground fault resistance formed between the negative side input terminal and the ground electrode.

9. The insulation state detecting device according to claim 3, further comprising:
a control signal generator that automatically generates timings of the control signals, which are given to the control switches, in synchronous with the change of a control cycle of charging and discharging of the flying capacitor.

10. The insulation state detecting device according to claim 9, wherein the control signal generator includes selecting switches which change generation conditions of the control signals.

11. The insulation state detecting device according to claim 9, further comprising:
a positive side Y condenser connected between the positive side power line and the ground electrode; and
a negative side Y condenser connected between the negative side power line and the ground electrode,
wherein the control signal generator automatically generates the timings of the control signals based on a relation between the control timings of the control switches and sizes of electrostatic capacitances of the positive side Y condenser and the negative side Y condenser.

12. The insulation state detecting device according to claim 9, wherein the control signal generator generates the control signals to close the control switches in synchronous with timings in which the flying capacitor is charged with a course which does not pass through both of a positive side ground fault resistance formed between the positive side input terminal and the ground electrode and a negative side ground fault resistance formed between the negative side input terminal and the ground electrode.

13. The insulation state detecting device according to claim 3, further comprising:
a control signal generator that generates the control signals to close the control switches except timings in which the flying capacitor is charged with a course which passes through a positive side ground fault resistance formed between the positive side input terminal and the ground electrode or a negative side ground fault resistance formed between the negative side input terminal and the ground electrode.

\* \* \* \* \*